US005361336A

United States Patent [19]

Atchison

[11] Patent Number: 5,361,336
[45] Date of Patent: Nov. 1, 1994

[54] METHOD FOR CONTROLLING AN INSTRUMENT THROUGH A COMMON INSTRUMENT PROGRAMMING INTERFACE

[75] Inventor: Lee A. Atchison, Ft. Collins, Colo.

[73] Assignee: Hewlett-Packard Company, Palo Alto, Calif.

[21] Appl. No.: 796,094

[22] Filed: Nov. 21, 1991

[51] Int. Cl.5 .................................. G06F 3/00
[52] U.S. Cl. ............................. 395/275; 364/579; 395/325
[58] Field of Search ............... 364/579, 580, 481, 200, 364/488, DIG. 1; 340/537; 374/181, 172; 324/73.1, 72.5; 395/500, 275, 114, 325

[56] References Cited

U.S. PATENT DOCUMENTS

| 3,849,726 | 11/1974 | Justice | 324/73.1 |
| 4,025,906 | 5/1977 | Riikonen | 395/275 |
| 4,263,650 | 4/1981 | Bennett et al. | 395/275 |
| 4,525,789 | 6/1985 | Kemper et al. | 364/481 |
| 4,852,041 | 7/1989 | Nakano | 395/500 |
| 4,855,905 | 8/1989 | Estrada et al. | 364/200 |
| 4,873,647 | 10/1989 | Banhi et al. | 364/488 |
| 5,111,423 | 5/1992 | Kopec, Jr. et al. | 364/DIG. 1 |
| 5,129,065 | 7/1992 | Priem et al. | 395/325 |
| 5,150,048 | 9/1992 | McAuliffe et al. | 324/73.1 |
| 5,167,021 | 11/1992 | Needham | 395/275 |
| 5,179,669 | 1/1993 | Peters | 395/325 |
| 5,191,655 | 3/1993 | Sarkissian | 364/DIG. 1 |
| 5,237,663 | 8/1993 | Srinivasan | 395/325 |

OTHER PUBLICATIONS

NI-VXI DOS Software Reference Manual, National Instruments Corp., 12109 Technology Blvd., Austin, Tex. 78727-6204, Oct. 1989.

Primary Examiner—Jack B. Harvey
Assistant Examiner—Hal D. Wachsman

[57] ABSTRACT

A system that defines a programming interface between a computer system and a test instrument independently of the electronic interface or operating system being used. This independence is accomplished by building a data structure, from a configuration system, which contains the operating system and electronic interface information that allows the system to perform different commands to different electronic interfaces or different operating systems. The system implements all commands that will be used by all operating systems and performs these commands even in operating systems where they are not necessary. The system also provides a formatted input/output capability for the instrument control functions. In addition to commonly understood formatting capability, such as conversion and printing of integer numbers, the interface provides instrument specific formatting capability, such as creating numbers that are compatible with the IEEE 488 interface.

14 Claims, 11 Drawing Sheets

METHOD FOR CONTROLLING AN INSTRUMENT THROUGH A COMMON INSTRUMENT PROGRAMMING INTERFACE

FIELD OF THE INVENTION

This invention relates to electronic test and measurement instruments and more particularly to such instruments which are controllable from a computer system. Even more particularly, this invention relates to a method for controlling such instruments with a common programming language interface.

BACKGROUND OF THE INVENTION

There are several methods used to connect an electronic instrument to a computer system, and three are very commonly used. The first is to connect the instrument to a computer over an IEEE 488 bus, also called the Hewlett Packard Interface Bus or the General Purpose Interface Bus. Another commonly used interface is the RS-232 serial communications interface. A third commonly used interface is the direct connection of the instrument to the computer system internal memory bus. An example of this third interface is the interface definition for an instrument connected to the VXI bus, as provided by National Instruments Corporation.

These three interfaces use considerably different commands to control an electronic instrument. Because of the variety of commands, if a program running in a computer system wishes to control an instrument, the programmer must decide which of the interfaces the instrument will use for connection, so that the correct programming commands can be used. This significantly reduces the portability of the program used to control the instrument, since the program must be rewritten if the instrument is connected via a different interface from the one originally programmed. This rewriting takes significant amounts of programmer time. It also means that three different sets of software must be shipped to access the instrument, one for each of the instrument interfaces.

Another problem exists when multiple computer systems, using different operating systems, are involved. The commands necessary to access the instrument over the various interfaces are often different for each operating system used. For example, the commands necessary to access an instrument over an RS-232 interface in the MS-DOS operating system (MS-DOS is a registered trademark of MicroSoft Corporation) are different from the commands necessary to access an instrument over an RS-232 interface in the Unix operating system (Unix is a registered trademark of AT & T). Therefore, not only must there be a separate program for each interface, there must be a separate program for each interface with each operating system to which the instrument may be connected.

Another problem caused by connecting through multiple interfaces and multiple operating systems is the need for the program to have the interface address defined within the program. Thus, only one address can conveniently be used with each combination of interface and operating system. If an instrument is not located at the address anticipated by the software, a different version of the software must be created and sent to the instrument user, causing considerable expense and delay.

One prior art instrument interface, the Hewlett Packard Device I/O Library (DIL), provides an input/output library of functions that can be used to access an instrument only with the Hewlett-Packard HPUX operating system environment. As an example of the problems identified above, the Device I/O Library has separate sets of commands for each of the interfaces.

Some of the interface commands could not be implemented in certain operating systems. For example, in the Unix operating system a user process issues a lock command to obtain exclusive control of a device such as an instrument. In the MS-DOS operating system, however, every process always has exclusive control of all input/output devices, therefore, the lock command is not only unnecessary, it is not implemented.

One of the most significant features of higher level programming languages is the ability to format data automatically before sending that data to an input/output device. For example, format statements originated with the Fortran language in the late 1950's. Typically, format statements convert integer numbers and floating point numbers in various formats into a displayable or printable format that can easily be understood by people. Thus formatted input/output has been typically used for printing information on a printer or displaying information on a terminal. In prior art systems, this capability can only be made available with instrument data by first formatting the data into a memory buffer and then sending the memory buffer contents to the instrument. Furthermore, current formatting capability cannot create numbers in special formats as required by the IEEE 488 interface standard.

It is thus apparent there is need in the art for an improved instrument programming interface that is independent of the particular electrical interface used to connect the instrument to the computer system. There is further need in the art for such a system that is also independent of the particular operating system being used to execute the program. A still further need is for such an interface that has formatted I/O capability, including the special formats of IEEE 488. The present invention meets these and other needs.

SUMMARY OF THE INVENTION

It is an aspect of the present invention to provide a common programming interface for computer controllable electronic instruments.

It is another aspect of the invention to provide such a common interface that is independent of the interface used to access the instrument.

Yet another aspect of the invention is to provide such a common interface that is independent of the operating system used by the controlling computer system.

A further aspect is to provide formatted I/O capability for exchanging data with the instrument.

A still further aspect is to provide an interface address independent method of accessing an instrument.

The above and other aspects of the invention are accomplished in a system that defines the instrument interface independently of the electronic interface or operating system being used. This independence is accomplished by building a data structure which contains the operating system and electronic interface information that allows the system to perform different commands to different electronic interfaces or different operating systems. This data structure is built from configuration information that is dynamically set up by each instrument user.

The system implements all commands that will be used by all operating systems and performs these commands even in operating systems where they are not needed. Thus, the user process performs the command and receives a return indicating that the command was successful even if the command was not needed to perform a function in the operating system.

The system also provides a formatted input/output capability for the instrument control functions. This formatted I/O capability allows the user process to read or write information from or to the instrument in a manner that is well understood by programmers. In addition to commonly understood formatting capability, such as conversion and printing of integer numbers, the interface provides instrument specific formatting capability, such as creating numbers that are compatible with the IEEE 488 interface.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

The following description of the invention is supplemented by the Standard Instrument Control Library Specification, attached hereto as Appendix A and incorporated herein by reference.

Figure 1:
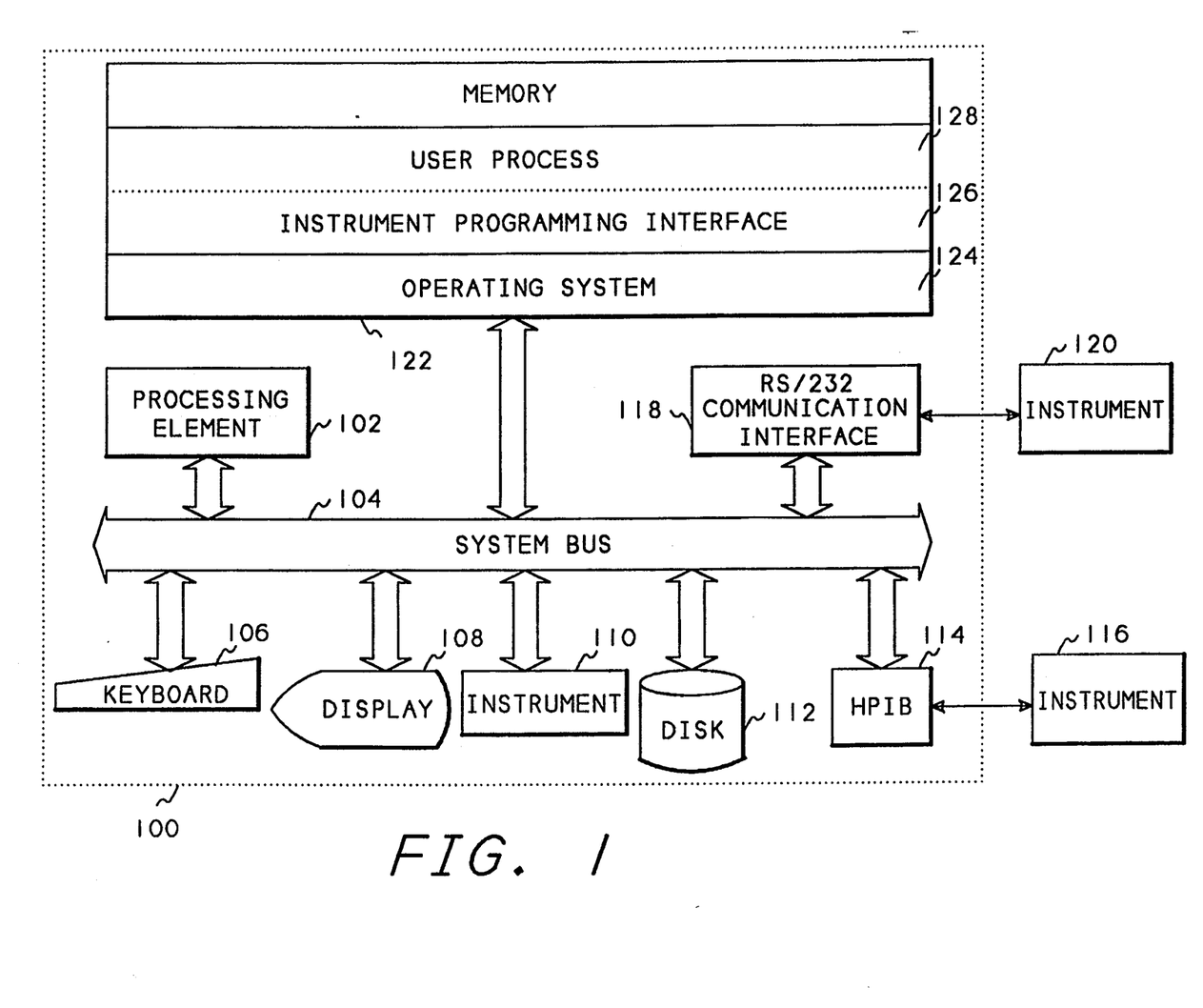
FIG. 1 shows a block diagram of a computer system that incorporates the present invention.

FIG. 1 shows a block diagram of a computer system that incorporates the instrument programming interface of the present invention. Referring now to FIG. 1, a computer system 100 contains a processing element 102 which executes the instructions of a user process 128, the instructions of an instrument programming interface 126 of the present invention, and the instructions of an operating system 124. The processing element 102 communicates with other elements of the system over a system bus 104. A keyboard 106 allows a user of the system to input information and a display 108 allows the system to output information to the user. A disk 112 stores the software of the system, the data of the user process 128, and other data for the system.

The present invention is designed to provide a common interface between the user process 128 and a variety of electronic instruments, independent of how those instruments are connected to the system. An instrument 110 is connected directly to the system bus 104. A second instrument 116 is connected through an IEEE 488 interface 114, also called an HPIB interface, and a third instrument 120 is connected through an RS-232 communications interface 118. Using the present invention, the user process 128 will use the same software calls and calling mechanism regardless of whether the instrument is a bus connected instrument, such as instrument 110, and HPIB connected instrument, such as instrument 116, or an RS-232 connected instrument, such as instrument 120.

Figure 2:
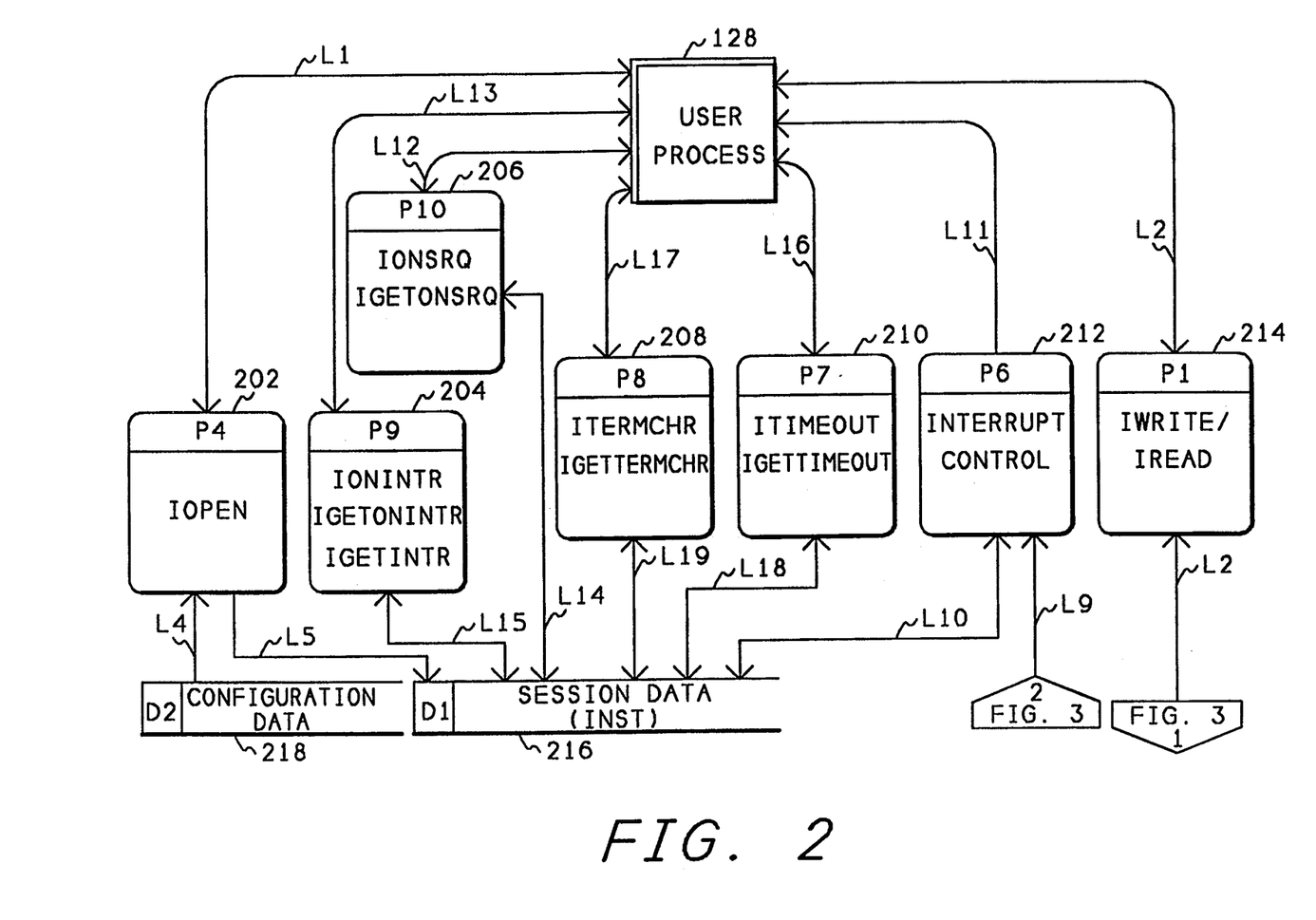
FIGS. 2 and 3 show a high level data flow diagram of the functions of the present invention.
Figure 3:
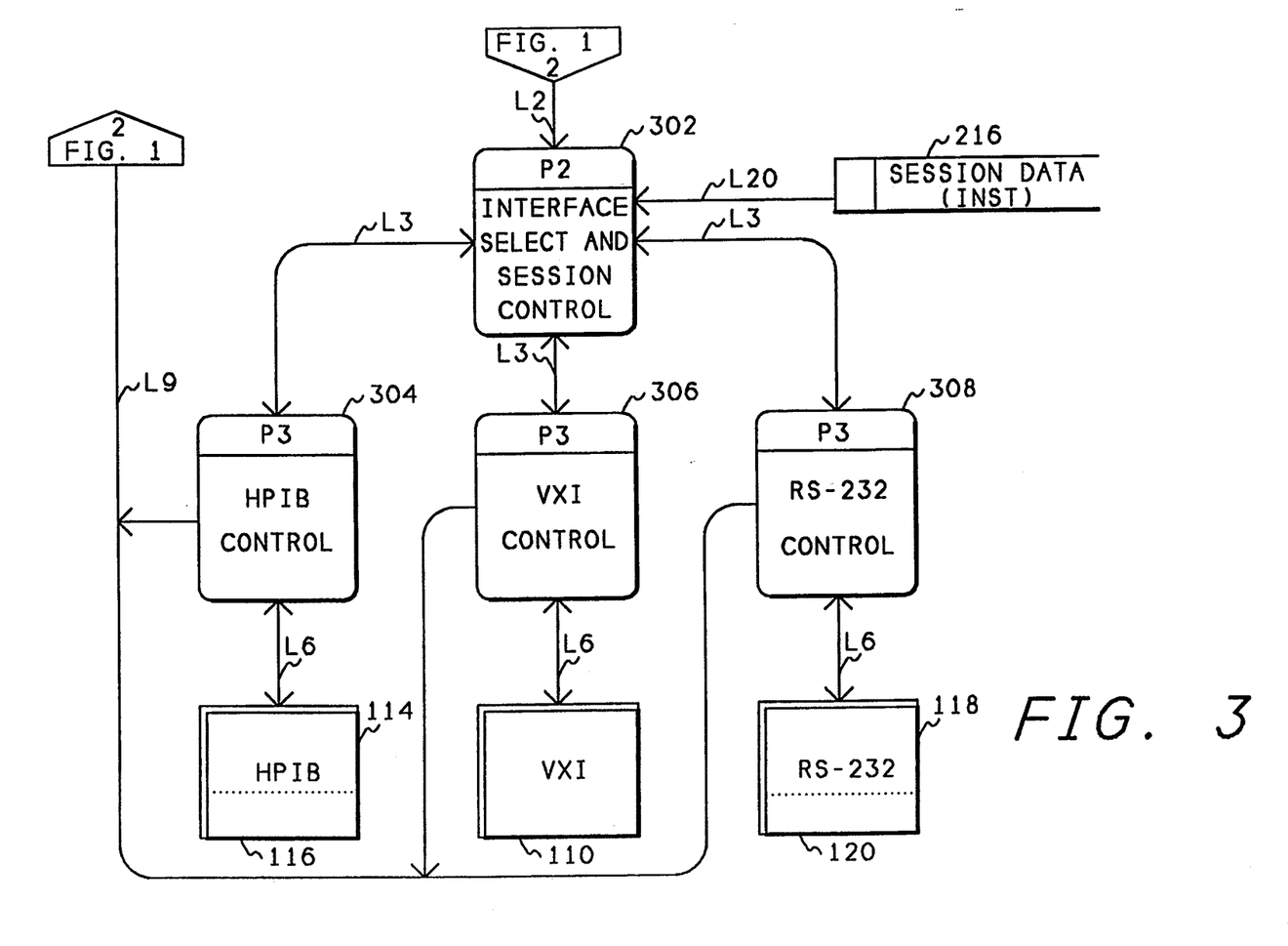

FIGS. 2 and 3 show the user process 128 and the top level interface of the instrument programming interface 126 of the present invention comprising processes 202, 204, 206, 208, 210, 212, and 214. Other top-level processes will be described below. Referring now to FIGS. 2 and 3, when the user process 128 desires to access an electronic instrument, it calls an IOPEN process 202 which determines where the instrument is located, that is, on a bus such as instrument 110 (FIG. 1), through RS-232 , or through an IEEE 488 (HPIB) interface. This determination is made by accessing configuration data 218 through dataflow L4. A complete list of dataflows and their contents is shown in Table 1. The configuration data is created by the user of the system, which allows the instrument address to be dynamically determined.

Once the IOPEN routine 202 determines where the instrument is located, it fills information into the session data 216 through dataflow L5. The session data 216 is used by many other processes of the system to access the actual instrument, and is more fully described in Table 2. After setting up the SESSION DATA 216, IOPEN 202 returns an INST ID, which is a pointer to the session data 216, to the user process over dataflow L1.

After IOPEN 202 returns to the user process, the user process reads or writes data from or to the instrument by calling the IWRITE/IREAD process 214 and passing data over the data flow L2. The data flow L2 contains the INST ID, which was returned to the user process by the IOPEN function, a pointer to the data to be sent or received, a length indicator defining the length of the data to be sent or received, a flag indicating whether an end indicator should be sent on an IWRITE operation, and a pointer to two data parameters which will be filled in by the IREAD or IWRITE process 214. The first of these data parameters is a count value which will be the actual number of data bytes that was sent or received by the IWRITE or IREAD operation. The second parameter that is filled in is a reason indicator which shows the reason why a read operation was terminated. The IWRITE/IREAD process 214 calls the interface select and session control process 302 shown in FIG. 3 and passes the data flow L2 during the call.

Figure 4:
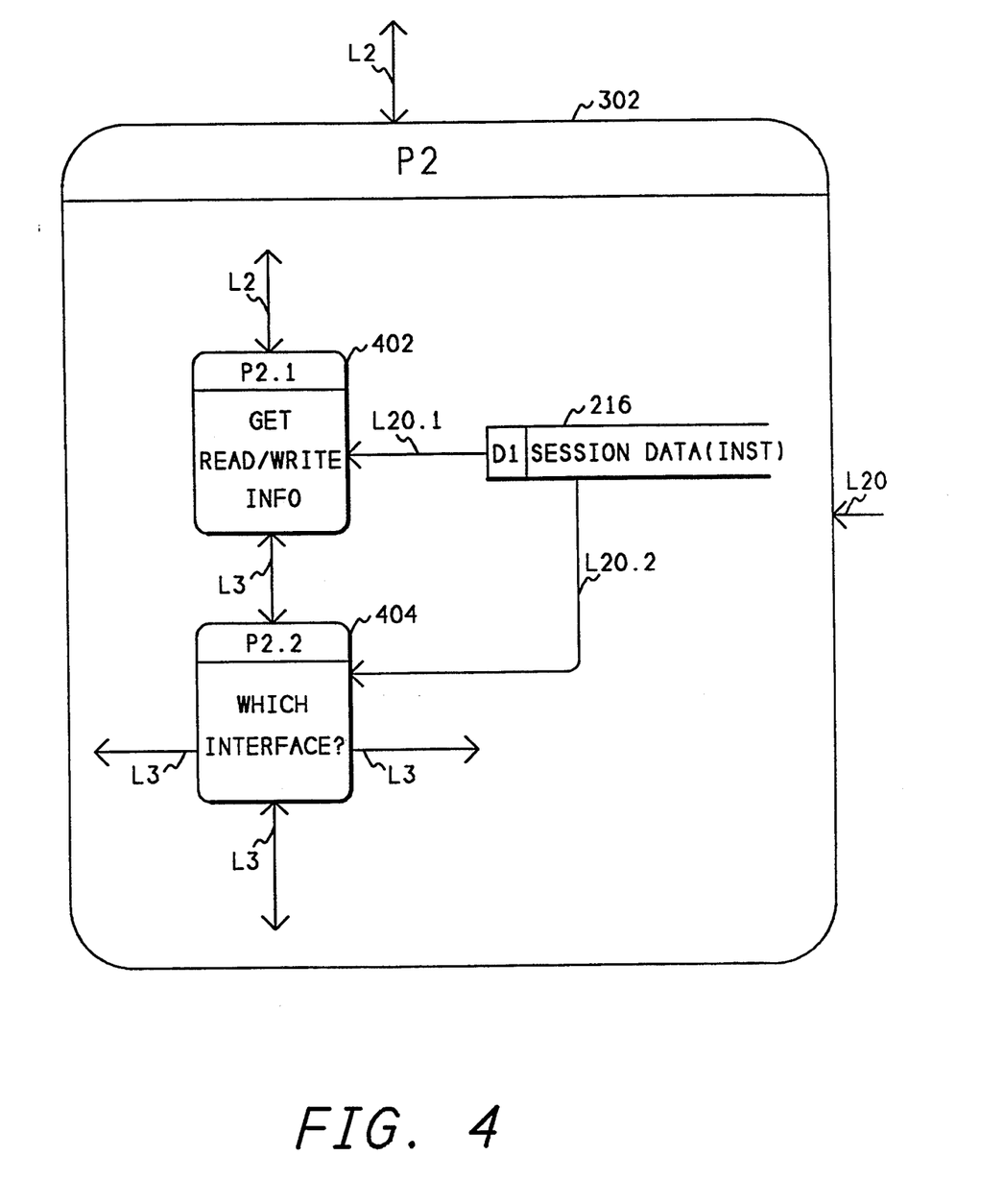
FIG. 4 shows a data flow diagram of the interface select and session control process of FIG. 3.

The interface select process 302 is shown in more detail in FIG. 4. Referring now to FIG. 4, the process contains two subprocesses GET READ/WRITE information process 402 and WHICH INTERFACE process 404. The GET READ/WRITE information process 402 obtains a time out value and a READ/WRITE termination character from the session data 216 over a data flow L20.1. This information is then passed to the WHICH INTERFACE process 404 over data flow L3. WHICH INTERFACE process 404 retrieves the instrument interface information from the session data 216 over a data flow 20.2 and uses this information to determine whether the instrument is directly connected to the system bus, is connected via an HPIB interface, or whether the instrument is connected via an RS-232 interface. The invention is not limited to these three electronic interfaces, however, but can be used with a variety of different interfaces. WHICH INTERFACE process 404 then calls the appropriate specific interface control process 304, 306, or 308 shown in FIG. 3.

Figure 5:
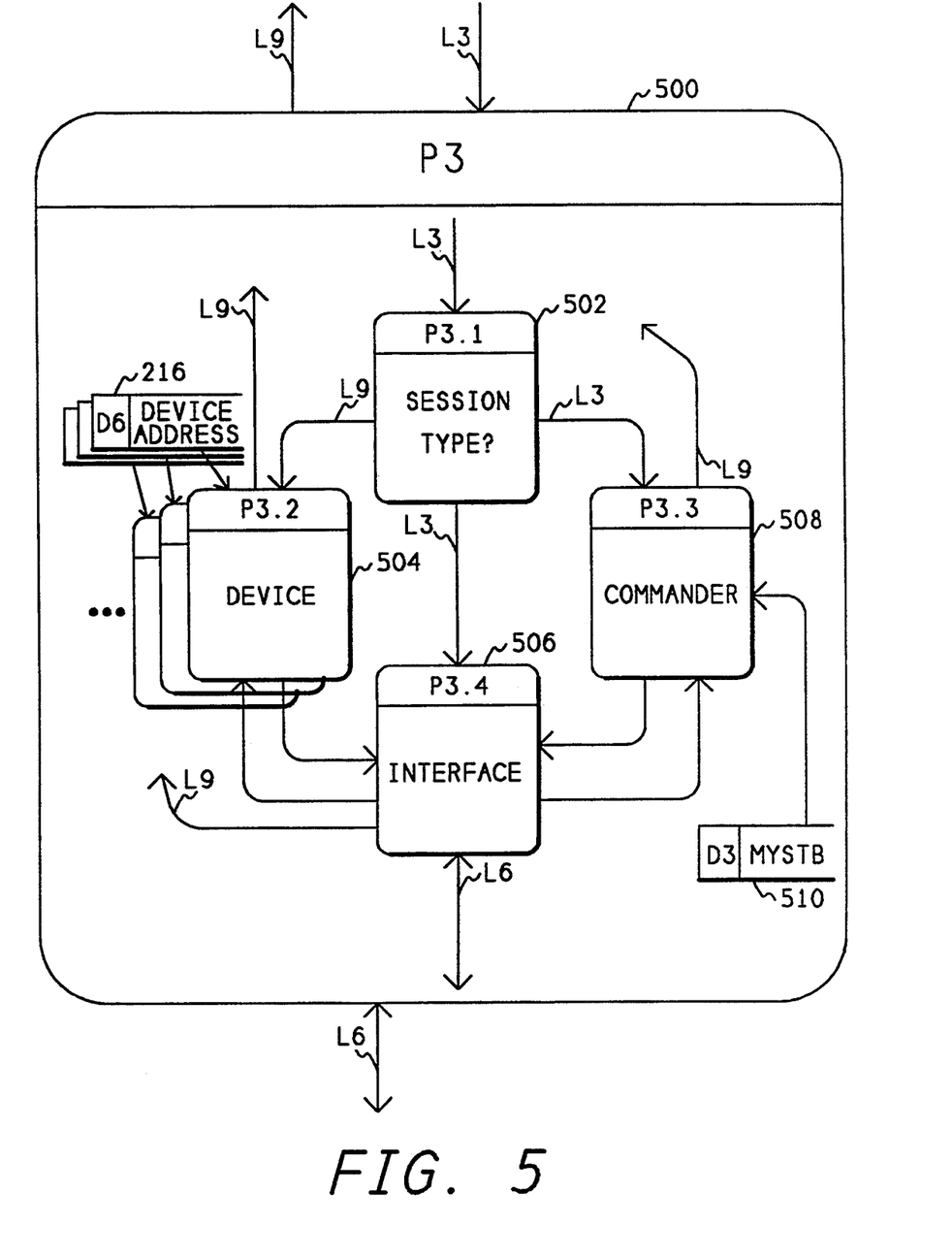
FIG. 5 shows a data flow diagram of the device control process of FIG. 3.

The process performed by the specific interface control processes 304, 306, or 308 is identical even though the interface used to access the instrument is different. A dataflow diagram for these three processes is shown in FIG. 5. Referring now to FIG. 5, the SESSION TYPE process 502 uses the data contained in data flow L3 to determine whether the I/O operation will be to a device or to another computer system acting as a commander. A commander, also called a controller, is a computer used to control one or more instruments. If the session type is a commander session, session type process 502 calls the COMMANDER process 508 to perform the input/output operation.

If the session type is directly to a device, session type process 502 calls the DEVICE process 504 to perform the operation. Several DEVICE processes 504 are shown, since several instruments can be connected to a single bus, such as the IEEE 488 bus, and the USER PROCESS may communicate with all of them. If the USER PROCESS wishes to communicate directly to the interface bus, SESSION TYPE process 502 calls the INTERFACE process 506 to directly interface to the instrument and perform the input/output operation. The COMMANDER process 508 and the DEVICE process 504 also use the INTERFACE process 506 to send and receive data to the instruments.

The DEVICE process 504, the COMMANDER process 508, and the INTERFACE process 506 may receive an interrupt from the instrument being controlled. When an interrupt does occur, the process receiving the interrupt calls the INTERRUPT CONTROL process 212 (FIG. 2) and passes the data flow L9 to the INTERRUPT CONTROL process 212.

Figure 6:
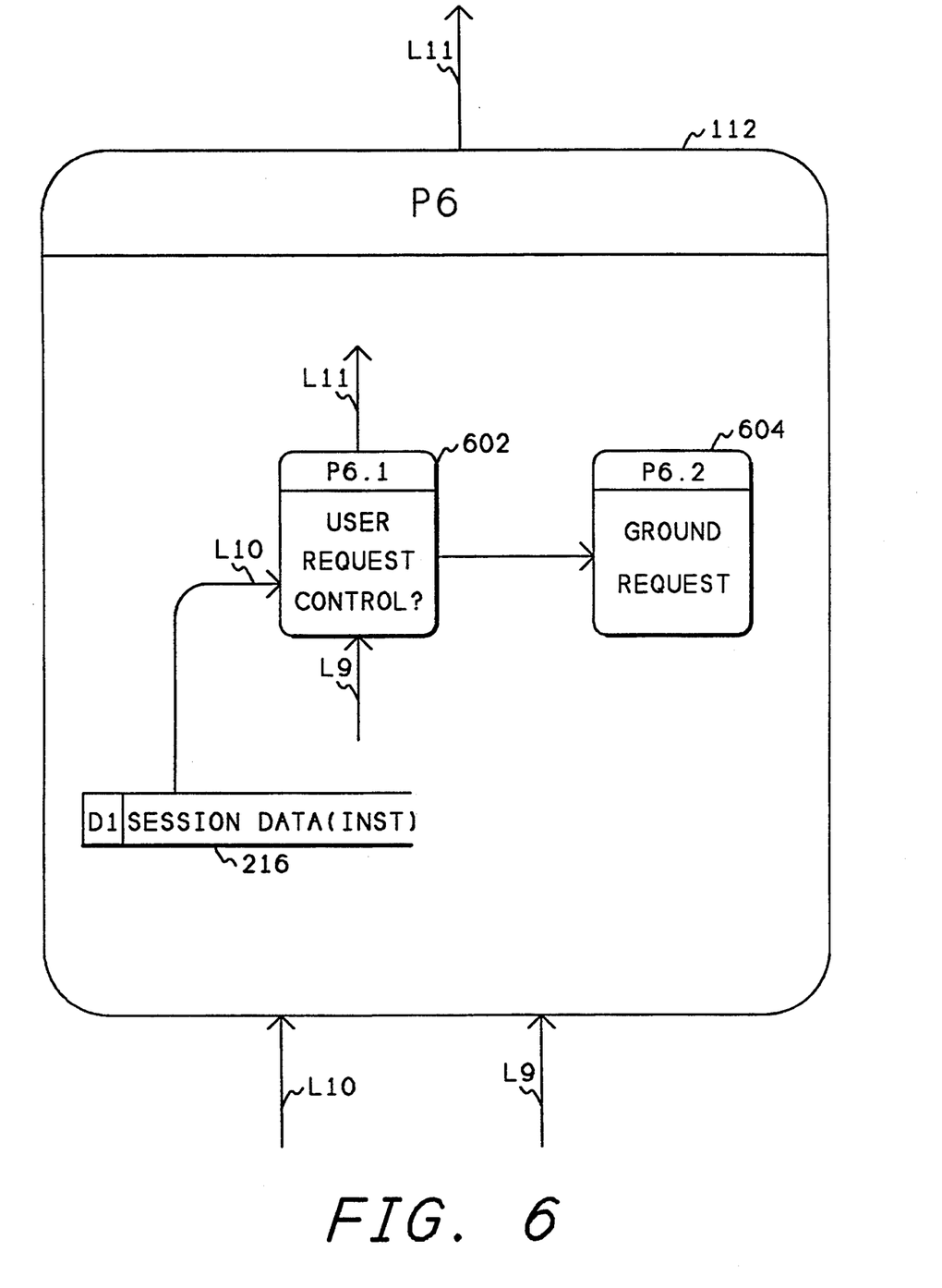
FIG. 6 shows a data flow diagram of the interrupt control process of FIG. 2.

The interrupt control process 212 is better shown in FIG. 6. Referring now to FIG. 6, USER REQUEST CONTROL process 602 receives the data identifying which interrupt occurred over data flow L9 and it obtains a user mask from the session data 216 over data flow L10. This mask identifies what type of interrupts are being accepted by the USER PROCESS. USER REQUEST CONTROL process 602 compares the type of interrupt received to the mask and determines whether the USER PROCESS is accepting this type of interrupt. If the USER PROCESS 128 is accepting the type of interrupt that occurred, USER REQUEST CONTROL process 602 calls the USER PROCESS 128 and passes data flow L10 to the USER PROCESS. Data flow L10 identifies which type of interrupt occurred, and it also contains the INST ID identifying which instrument is involved. If USER REQUEST CONTROL process 602 determines that the USER PROCESS is not accepting the type of interrupt that occurred, it calls GROUND REQUEST process 604 which ignores the interrupt.

Several other processes shown in FIG. 2 may be called by the user process. USER PROCESS 128 may call the IONINTR process 204 to provide the USER PROCESS the ability to set up interrupt information. The USER PROCESS passes the INST ID, an interrupt handler function pointer, or a reference variable to be set, over a data flow L13. The IONINTR routine 204 then sets up the information which is used by the INTERRUPT CONTROL process 212 when an interrupt does occur.

The USER PROCESS may also call the IONSRQ process 206 to set up access to service request handlers. When this call occurs, the USER PROCESS passes the INST ID, a pointer to the service request handler, and a reference variable to be set. The IONSRQ process 206 then stores this data into the session data 216 over a data flow L14.

USER PROCESS 128 may also call the ITERMCHR process 208 to obtain the current termination character, or to set the termination character that will be used in input/output operations. Data flow L17 contains the INST ID, the termination character, or a pointer to a reference variable where the current termination character will be stored by the ITERMCHR process 208.

In a similar manner, the USER PROCESS 128 may also call the ITIMEOUT process 210 to access or set the time out value. When called, data flow L16 contains the instrument ID, a time out value, or a pointer to a reference variable where the current time out value will be stored by the ITIMEOUT routine to 110.

One of the most significant features of higher level programming languages is the ability to format data automatically before sending that data to an input/output device. Typically, format statements convert integer numbers, and floating point numbers in various formats into a displayable or printable format that can easily be read by people, thus formatted input/output has been typically used for printing information or displaying information on a terminal. The present invention provides these capabilities for data being sent to or received from an electronic test instrument, however, the invention extends these capabilities to special number formats that are unique to instrumentation. For example, IEEE standard 488 defines several different number formats which are used in interchanging data with electronic instruments. The present invention provides the ability to create these number formats within the formatted I/O capability.

The IEEE 488 formats used by the invention are a series of flags, which modify the meaning of the conversion specification within the format string. The flags are shown in Table 3.

Figure 7:
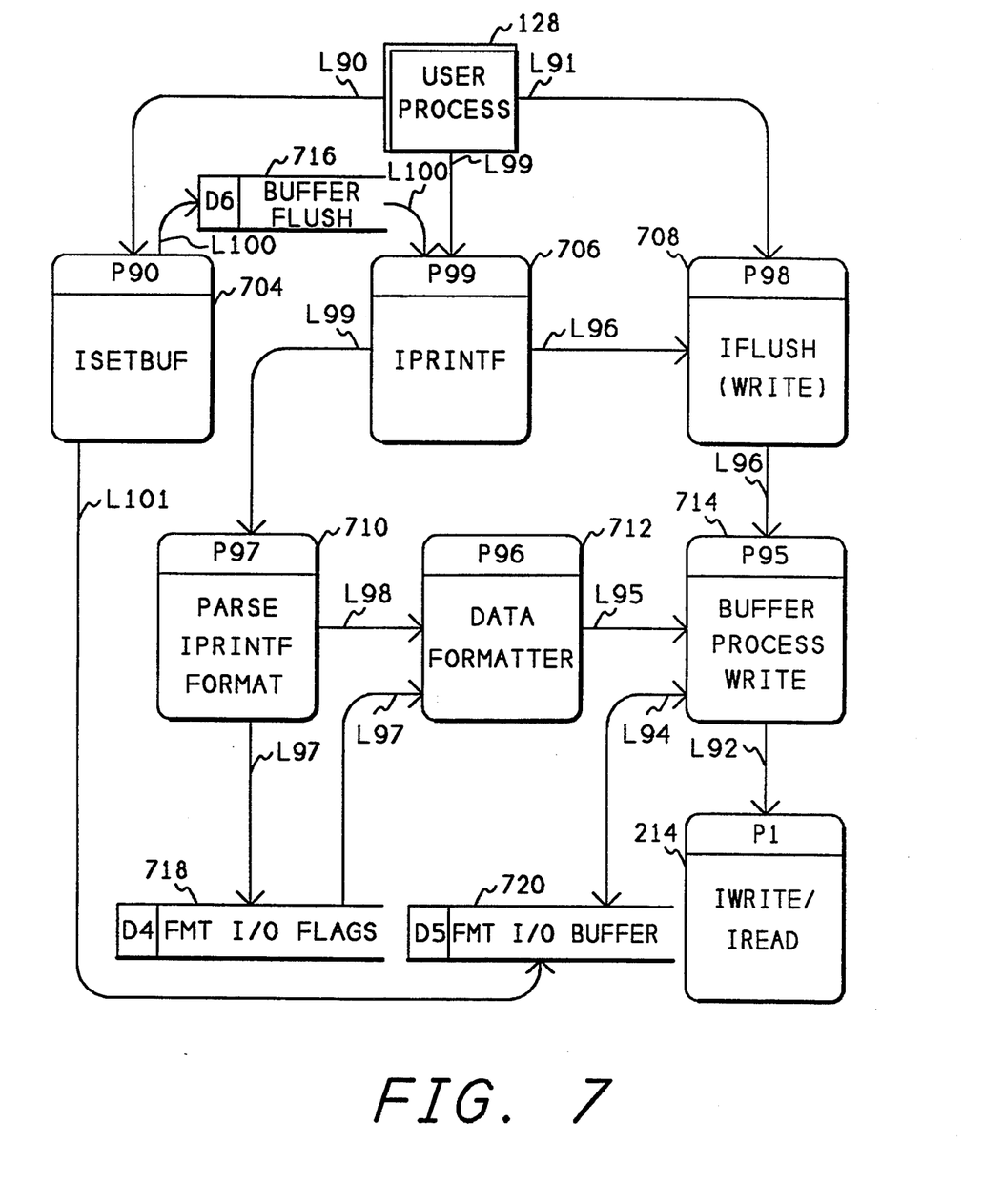
FIG. 7 shows a data flow diagram of the formatted output process of the invention.

FIG. 7 shows a data flow diagram of the formatted output process of the invention. Referring now to FIG. 7, the USER PROCESS 128 (also shown in FIG. 1) has three functions available for performing formatted output to an instrument. ISETBUF process 704 provides the USER PROCESS 128 access to control the formatted input/output buffers. When the USER PROCESS 128 calls the ISETBUF process 704 it passes data flow L90 which includes the INST ID, a mask indication for the read or write buffer, and the size of the buffer. ISETBUF process 704 stores this information into the FMT I/O BUFFER data store 720 through data flow L101.

The USER PROCESS 128 can also flush the output buffer, that is, empty it of all its contents, by calling the IFLUSH process 708. When the IFLUSH process 708 is called, data flow L91 contains the INST ID and a buffer mask which indicates which of the formatted input/output buffers are to be flushed. IFLUSH process 708 then calls BUFFER PROCESS WRITE 714 to write the data to the instrument. BUFFER PROCESS WRITE 714 in turn calls the IWRITE/IREAD process 214 (FIG. 2) to perform the output operation.

USER PROCESS 128 calls the IPRINTF process 706 to perform a formatted output operation. When IPRINTF 706 is called, data flow L99 contains the INST ID, the format string containing the format specifications for how the data should be formatted, and a series of arguments which contain the data that is being output. IPRINTF process 706 calls the PARSE IPRINTF FORMAT process 710 which analyzes the format string and converts the format parameters into information to be used by the DATA FORMATTER process 712. PARSE IPRINTF format 710 stores information in the FMT I/O FLAGS data store 718 through a data flow L97. The data flow L97 contains an end character, field width information, the precision indicating the number of digits to the right of a decimal place for number formats or a maximum width for string formats, a justify flag, a number format flag, and a prefix character. PARSE IPRINTF format process 710 then calls DATA FORMATTER process 712. The DATA FORMATTER process 712 takes the converted conversion parameters and the formatted I/O flags from the FMT I/O FLAGS data store 718 and converts the user's arguments into the desired output data. DATA FORMATTER process 712 then calls BUFFER PROCESS WRITE 714 and passes the data flow L95, which contains the data to be sent to the instrument. BUFFER PROCESS WRITE then calls IWRITE/IREAD 214 to perform the output operation to the instrument.

After the data has been written to the instrument, control returns to IPRINTF 706 which reads the buffer flush flag over data flow L100 and determines whether the buffer should be flushed after the data has been output. If the flag indicates that the buffer should be flushed, IPRINTF process 706 calls IFLUSH process 708 to flush the WRITE buffers. Control then returns to the USER PROCESS 128.

Figure 8:
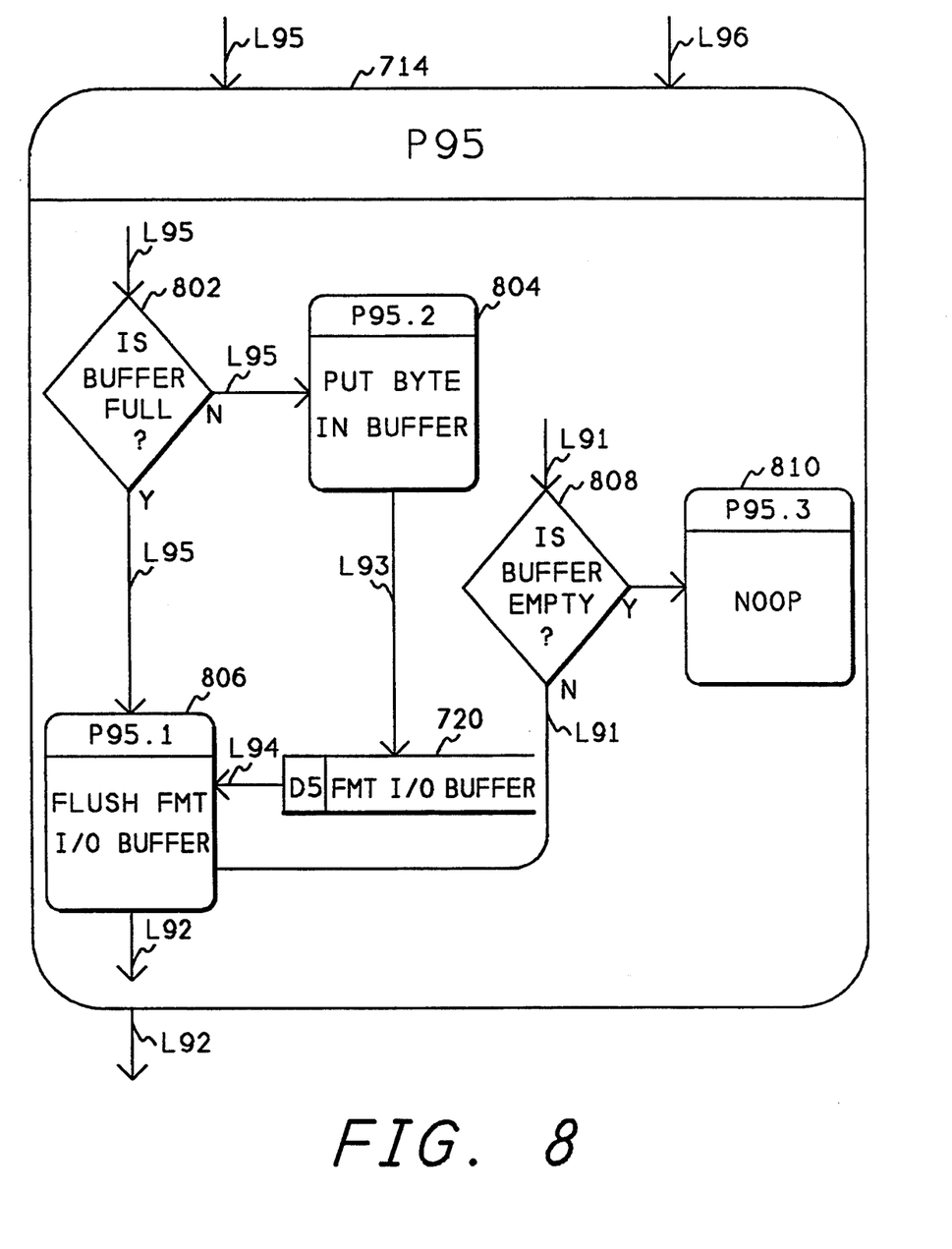
FIG. 8 shows a data flow diagram of the buffer process write process of FIG. 7.

FIG. 8 shows a data flow diagram of the BUFFER PROCESS WRITE 714. Referring now to FIG. 8, when BUFFER PROCESS WRITE 714 is called from the IFLUSH process 708 using data flow L91, control goes to block 808 which determines whether the buffer is empty. If the buffer is empty, block 808 calls block 810 which performs a NOOP operation and returns to IFLUSH process 708 since there is no need to flush an empty buffer. If the buffer is not empty, block 808 transfers to block 806 which gets the buffer size from the FMT I/O BUFFER data store 720 over data flow L94 and calls the IWRITE/IREAD process 214 (FIG. 2) passing data flow L92 to write the contents of the buffer to the instrument.

If the BUFFER PROCESS WRITE 714 is called with data flow L95 from the data formatter process 712, block 802 determines whether the buffer is full. If the buffer is full, control goes to block 806 which retrieves the buffer contents from the FMT I/O BUFFER 720 over data flow L94 and sends these contents to the IWRITE/IREAD process 214 to write the contents to the instrument. If the buffer is not full, block 802 transfers to block 804 which puts the data into the FMT I/O BUFFER 720 through data flow L93.

Figure 9:
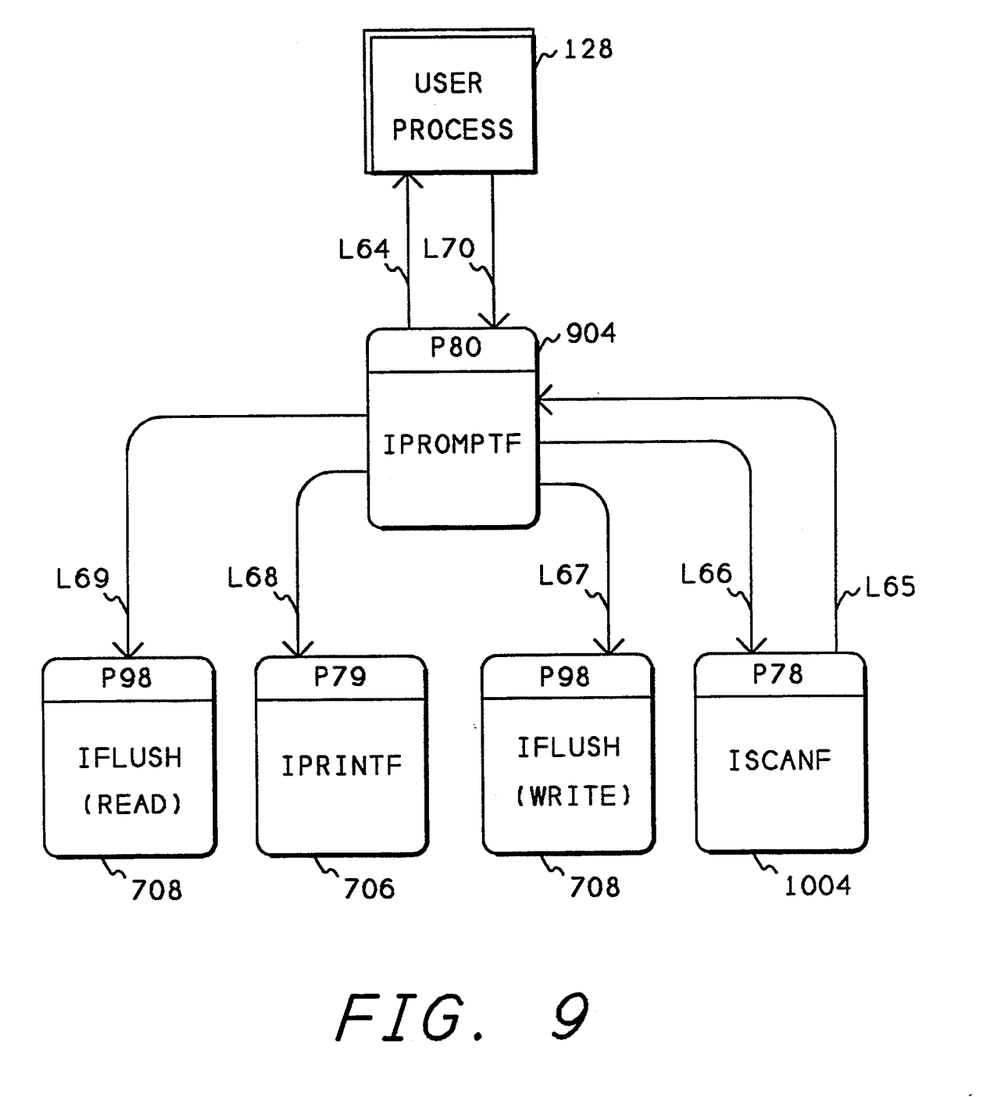
FIG. 9 shows a data flow diagram of the formatted prompt process of the invention.

FIG. 9 shows a data flow diagram of the formatted prompt process of the invention. Prompt provides a means for the computer to send information to an instrument and then immediately receive information back from the instrument, thus prompt is a combination of IPRINTF described above and ISCANF described below. Referring now to FIG. 9, the USER PROCESS 128 calls the IPROMPTF process 904 sending the data flow L70 during the call. The data flow L70 contains the INST ID, a format string to be used for writing data to the instrument, a format string to be used for reading data back from the instrument, and the arguments used for both the write and the read formats. The IPROMPTF process 904 provides the user level access to an atomic output and input with an instrument. This atomic output and input means that all interrupts are held off until the IPROMPTF process 904 is completed. IPROMPTF 904 first calls IFLUSH process 708 using data flow L67 to flush the write buffer before sending data to the instrument. The data flow L67 comprises an INST ID and a buffer mask to define the buffer being flushed. IPROMPTF 904 then calls IPRINTF 706 described above with respect to FIG. 7, to send formatted data to the instrument. IPROMPTF then calls IFLUSH process 708 to flush the read buffers and sends data flow L69 to the IFLUSH process 708. Data flow L69 contains the INST ID and a buffer mask to identify the read buffer to be flushed. IPROMPTF 904 then calls ISCANF process 1004 sending data flow L66 to perform the read from the instrument. Data flow L66 contains the INST ID and the read format string. When ISCANF process 1004 returns to IPROMPTF, it returns data flow L65 which contains the data that was read from the instrument. IPROMPTF then returns the data to the USER PROCESS in data flow L64.

Figure 10:
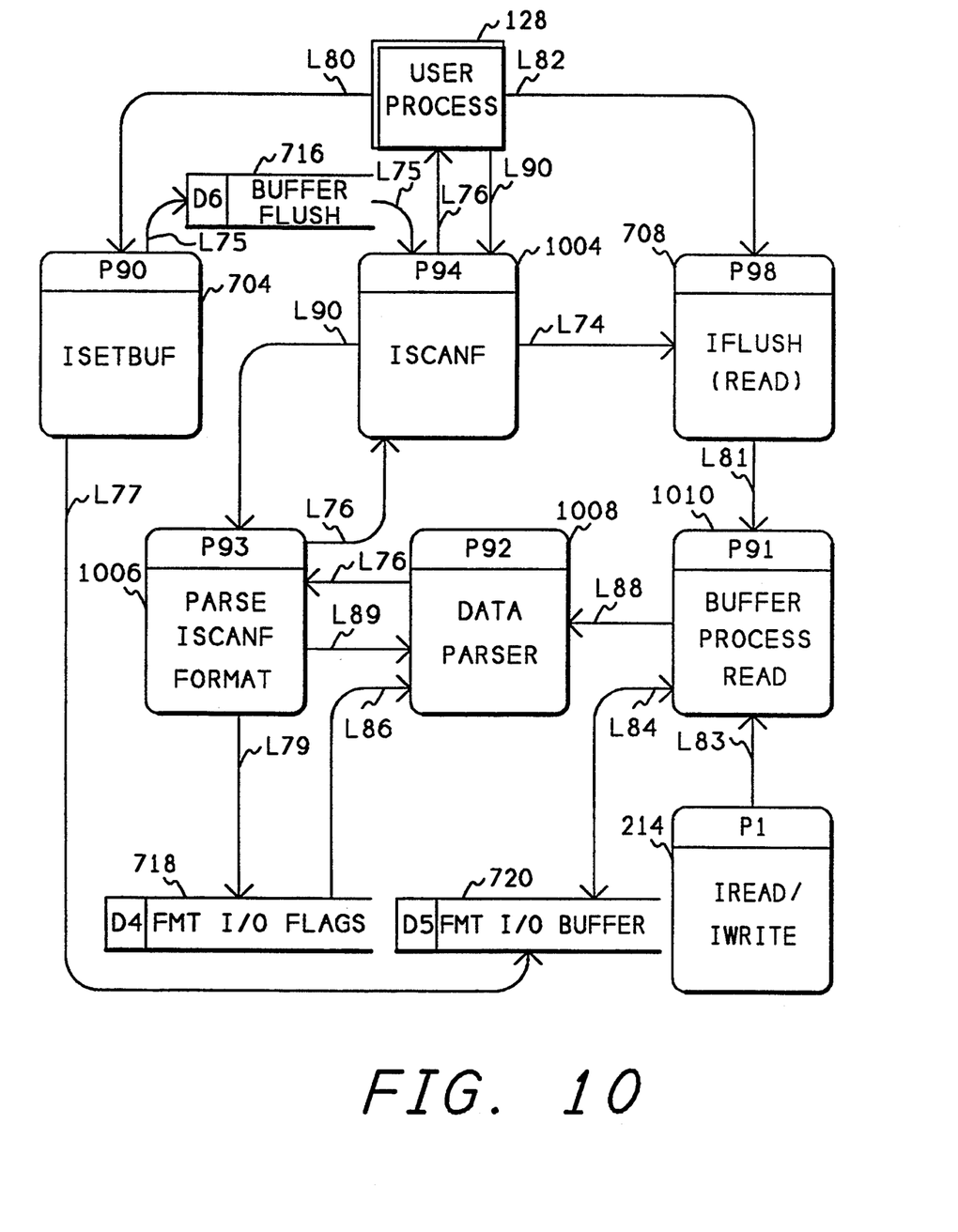
FIG. 10 shows a data flow diagram of the formatted input data scan process of the invention.

FIG. 10 shows a data flow diagram of the formatted input process of the invention. Referring now to FIG. 10, the USER PROCESS 128 (also shown in FIG. 1) has three functions available for performing formatted input to an instrument. ISETBUF process 704 provides the USER PROCESS 128 access to control the formatted input/output buffers. When the USER PROCESS 128 calls the ISETBUF process 704 it passes data flow L80 which includes the INST ID, a mask indication for the buffer, and the size of the buffer. ISETBUF process 704 stores this information into the FMT I/O BUFFER data store 720 through data flow L77.

The USER PROCESS 128 can also flush the input buffer, that is, empty it of all its contents, by calling the IFLUSH process 708. When the IFLUSH process 708 is called, data flow L82 contains the INST ID and a buffer mask which indicates which of the formatted input/output buffers are to be flushed. IFLUSH process 708 then calls BUFFER PROCESS READ 1010 to read any remaining data from the instrument. BUFFER PROCESS READ 1010 in turn calls the IWRITE/IREAD process 214 (FIG. 2) to perform the input operation. After the data is read from the instrument, it is removed from the buffer and discarded.

USER PROCESS 128 calls the ISCANF process 1004 to perform a formatted input operation. When ISCANF 1004 is called, data flow L90 contains the INST ID, the format string containing the format specifications for how the data should be formatted, and a series of arguments which will contain the data that is being input. ISCANF process 1004 calls the PARSE ISCANF FORMAT process 1006 which analyzes the format string and converts the format parameters into information to be used by the DATA PARSER process 1008. PARSE ISCANF FORMAT 1006 stores information in the FMT I/O FLAGS data store 718 through a data flow L79. The data flow L79 contains an end character, field width information, the precision indicating the number of digits to the right of a decimal place for number formats or a maximum width for string formats, a justify flag, a number format flag, and a prefix character. PARSE ISCANF FORMAT process 1006 then calls DATA PARSER process 1008. DATA PARSER process 1008 then calls BUFFER PROCESS READ 1010 and passes the data flow L88, which will contain the data to be received from the instrument. BUFFER PROCESS READ 1010 then calls IWRITE/IREAD 214 to perform the input operation from the instrument. After the read is performed, control returns to the DATA PARSER 1008. The DATA PARSER process 1008 takes the converted conversion parameters and the formatted I/O flags from the FMT I/O FLAGS data store 718 and converts, or unformats, the data read by BUFFER PROCESS READ 1010 into the desired input data.

After the data has been read from the instrument, control returns to ISCANF 1004 which reads the buffer flush flag over data flow L75 and determines whether the buffer should be flushed after the data has been input. If the flag indicates that the buffer should be flushed, ISCANF process 1004 calls IFLUSH process 708 to flush the read buffers. Control then returns to the USER PROCESS 128.

Figure 11:
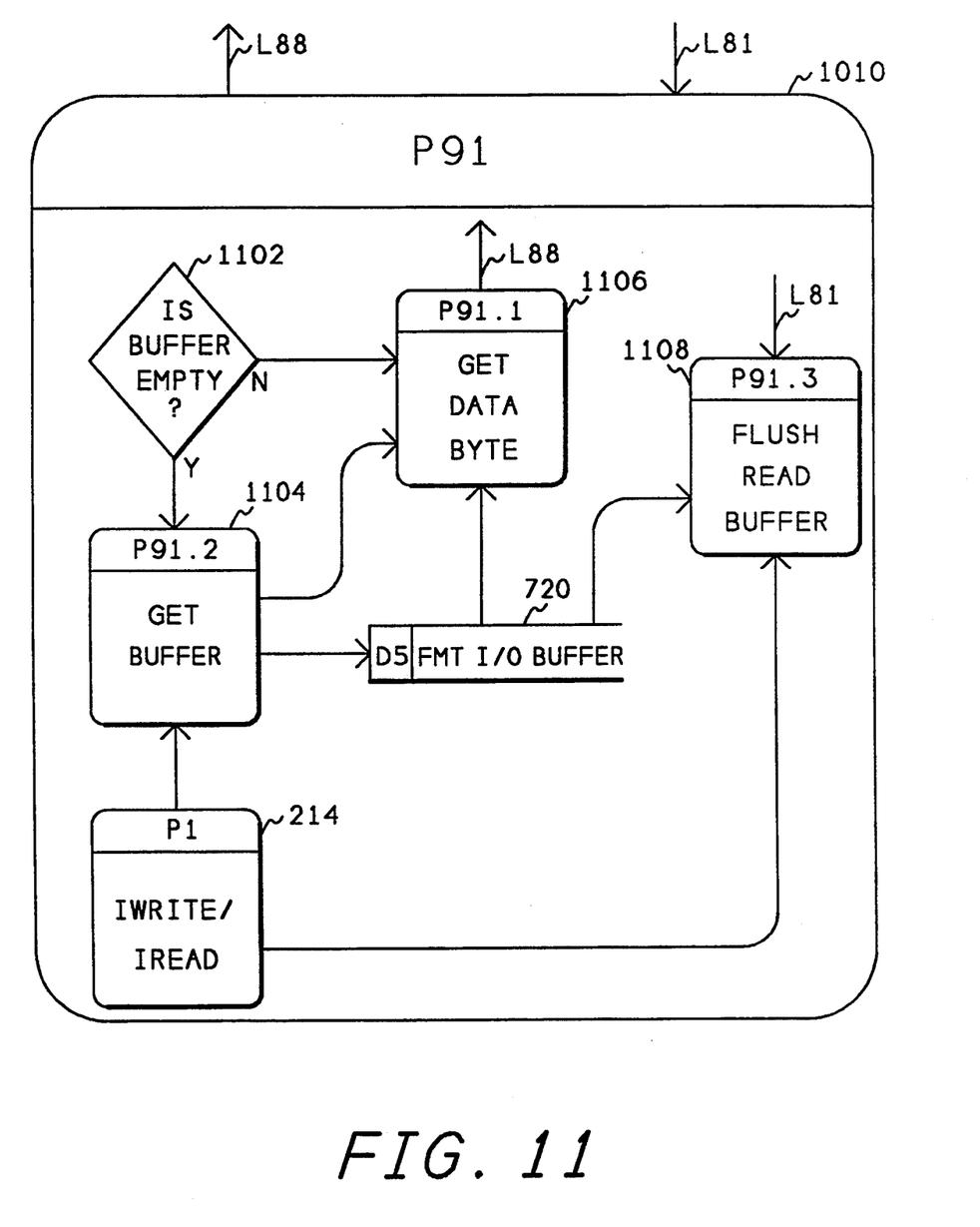
FIG. 11 shows a data flow diagram of the buffer process read process of FIG. 10.

FIG. 11 shows a data flow diagram of the BUFFER PROCESS READ 1010. Referring now to FIG. 11, when BUFFER PROCESS READ 1010 is called from the IFLUSH process 708 using data flow L81, control goes to block 1108 which CALLS IWRITE/IREAD process 214 which reads data until the buffer is empty. When BUFFER PROCESS READ 101 is called from the DATA PARSER process 1008 using data flow L88, block 1102 determines if the buffer is empty. If the buffer is not empty, block 1102 transfers to block 1106 which gets the buffer size from the FMT I/O BUFFER data store 720 and gets data from the FMT I/O BUFFER 720 which it returns over data flow L88. If the buffer is empty, block 1102 calls block 1104 to read data into the buffer. Block 1104 calls IWRITE/IREAD process 214 to read the data, then GET BUFFER 1104 calls block 1106 to send the data back to the caller on dataflow L88.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

TABLE 1

Data Flow Descriptions

| | | |
|---|---|---|
| L1 | Data returned from IOPEN | |
| | INST ID | instrument data structure identification |
| L2 | User Supplied Data for iread ( ) and iwrite( ) | |
| | INST ID | INST ID returned by iopen( ) |
| | Data buffer | pointer to data to be sent/received |
| | Data length | length in bytes of data to be sent/received |
| | End flag | none zero if END indicator should be sent (iwrite( ) only) |
| | Actual count | actual number of data bytes sent/received |
| | Reason | reason why read terminated (iread( ) only) |
| L3 | Data to/from Bus | |
| | L2 Data | all data associated with L2 |
| | Timeout | read/write timeout value |
| | Termchar | read termination char |
| | RW_flags | read/write flags (block/non-block) |
| L4 | Configuration Data | |
| | Address | Instrument bus address |
| | InfType | Interface Type |
| | InstType | Instrument Type |
| L5 | Instrument Data | |
| | Address | Instrument bus address |
| | InfType | Interface Type |
| | InstType | Instrument Type |
| L6 | Output to/from bus | |
| | Data | data read/written to/from register accesses |
| L9 | Interrupt Data | |
| | Interrupt | data telling which interrupts have occurred |
| L10 | Users Interrupt Data | |
| | Users mask | the users interrupt mask |
| L11 | User Interrupt Data | |
| | Masked Intr | data telling which (of those the user has requested) have occurred |
| | INST ID | INST ID setup by iopen( ) |
| L12 | Service Request Information | |
| | INST ID | INST ID returned by iopen( ) |
| | Function addr | Address of function to use to install as the service request or reference variable for the address of the last function install to handle service request |
| L13 | Interrupt Information | |
| | INST ID | INST ID returned by iopen( ) |
| | Function addr | Address of function to use to install as the interrupt handler or reference variable for the address of the last function install to handle interrupts |
| | Interrupt num | List of interrupts that have occurred |
| L14 | SRQ Data | |
| | Function addr | Address of function to use to install as the service request or reference variable for the address of the last function install to handle service request |
| L15 | Interrupt Data | |
| | Function addr | Address of function to use to install as the interrupt handler or reference variable for the address of the last function installed to handle interrupts |
| | Interrupt num | List of interrupts that have occurred |
| L16 | Timeout | |
| | INST ID | INST ID returned by iopen( ) |
| | Msecs | Value of timeout in milliseconds |
| L17 | Termination Character | |
| | INST ID | INST ID returned by iopen( ) |
| | Char | Character to used for read/write termination |
| L18 | Timeout | |
| | Msecs | Value of timeout in milliseconds |
| L19 | Termination Character | |
| | Char | Character to used for read/write termination |
| L20 | Control Information | |
| | Msecs (.1) | Value of timeout in milliseconds |
| | Char (.1) | Character to used for read/write termination |
| | Interface (.2) | Which interface |
| L65 | User Supplied Arguments | |
| | arg[m+1,n] | argument(s) used to satisfy flags and/or conversion commands (no arguments are required) |
| L66 | iscanf( ) Arguments | |
| | INST ID | INST ID returned by iopen( ) |

TABLE 1-continued

Data Flow Descriptions

| | | |
|---|---|---|
| | Format | read format string |
| L67 | Arguments for iflush( ) | |
| | INST ID | INST ID returned by iopen( ) |
| | Buffer Mask | Buffer mask for write buffer |
| L68 | iprintf( ) Arguments | |
| | INST ID | INST ID returned by iopen( ) |
| | Format | write format string |
| | arg[1,m] | argument(s) used to satisfy flags and/or conversion commands (no arguments are required) |
| L69 | Arguments for iflush( ) | |
| | INST ID | INST ID returned by iopen( ) |
| | Buffer Mask | Buffer mask for read buffer |
| L70 | User Supplied Data for ipromptf( ) | |
| | INST ID | INST ID returned by iopen( ) |
| | Write Format | format string |
| | Read Format | format string |
| | arg[1,n] | argument(s) used to satisfy flags and/or conversion commands (no arguments are required) |
| L74 | Instrument ID | |
| | INST ID | INST ID setup by iopen( ) |
| L75 | Buffer Flush Flag | |
| | Flush Flag | flush I/O buffer at end of iscanf( ) |
| L76 | User Supplied Arguments | |
| | arg[1−n] | argument(s) used to satisfy flags and/or conversion commands (no arguments are required) |
| L77 | Buffer Size | |
| | Buffer Size | size of Formatted I/O buffer |
| L80 | User Supplied Data for isetbuf( ) | |
| | INST ID | INST ID returned by iopen( ) |
| | Buffer Mask | indicates which Formatted I/O buffer |
| | Size | buffer size (The size can cause several different behaviors depending on its size. |
| L81 | Instrument ID | |
| | INST ID | INST ID setup by iopen( ) |
| L82 | User Supplied Data for iflush( ) | |
| | INST ID | INST ID returned by iopen( ) |
| | Buffer Mask | Indicates which Formatted I/O buffer to flush |
| L84 | Buffered Data | |
| | Data | bytes of data in raw format from an iread( ) |
| L86 | Formatted I/O Flags | |
| | Width | field width |
| | Precision | number of digits to the right of the decimal for number formats or maximum width for string formats |
| | Justify | right or left justify? |
| | Number | i.e. NR1, etc. |
| | Format | |
| | Prefix | prefix character |
| L88 | Data | |
| | Raw Data | bytes of data as they are needed by Data parser |
| L89 | Converted Conversion Command Data | |
| | Conversion | conversion commands converted to computer |
| | Data | readable information |
| L90 | User Supplied Data for iscanf( ) | |
| | INST ID | INST ID returned by iopen( ) |
| | Format | format string |
| L90 | User Supplied Data for userbuf( ) | |
| | INST ID | INST ID returned by iopen( ) |
| | Buffer Mask | indicates which formatted I/O buffer |
| | Size | buffer size (The size can cause several different behaviors depending on its size. |
| L91 | User Supplied Data for iflush( ) | |
| | INST ID | INST ID returned by iopen( ) |
| | Buffer Mask | Indicates which formatted I/O buffer to flush |
| L94 | Final Formatted Data | |
| | Buffered Data | data put into the buffer or sent to iwrite( ) (only sent to iwrite( ) on a flush) |
| L95 | Formatted Data | |
| | Data | bytes of data as they are formatted |
| L96 | Instrument ID | |
| | INST ID | INST ID setup by iopen( ) |
| L97 | Formatted I/O Flags | |
| | END Char | append an end character to end of formatted data |
| | Width | field width |
| | Precision | number of digits to the right of the decimal for number formats or maximum width for string formats |
| | Justify | right or left justify? |
| | Number | i.e. NR1, etc. |
| | Format | |
| | Prefix | prefix character |
| L98 | Converted Conversion Command Data | |
| | Conversion Data | conversion commands converted to computer readable information |
| L99 | User Supplied Data for iprintf( ) | |
| | INST ID | INST ID returned by iopen( ) |
| | Format | format string |
| | arg[1−n] | argument(s) used to satisfy flags and/or conversion commands (no arguments are required) |
| L100 | Buffer Flush Flag | |
| | Flush Flag | flush I/O buffer at end of iprintf( ) |
| L101 | Buffer Size | |
| | Buffer Size | size of formatted I/O buffer |

TABLE 2

The data fields in the session data (INST) are:

Interface Type
Session Type
Interface Address
Device Address
User's Data Pointer
Termination Character
Read Buffer Size/Mode
Write Buffer Size/Mode
Ihint Value
SRQ Handler Address
Interrupt Handler Address
Session Interrupt Mask (User)
Lock Wait Flag
Timeout Value

TABLE 3

@1  Specifies that the conversion is to create and NR1 compatible number, as defined in the IEEE 488.2 standard.
@2  Specifies that the conversion is to create an NR2 compatable number, as defined in the IEEE 488.2 standard.
@3  Specifies that the conversion is to create an NR3 compatible number, as defined in the IEEE 488.2 standard.
@H  Specifies that the conversion is to create an IEEE 488.2 hexadecimal numeric response data number of the form "#H . . ." where "." is replaced by a valid hex digit.
@Q  specifies that the conversion is to create and IEEE 488.2 octal numeric response data number of the form "#Q . . ." where "." is replaced by a valid octal digit.
@B  specifies that the conversion is to create and IEEE 488.2 binary numeric response data number of the form "#B . . ." where ".38 is replaced by a valid binary digit.
"−"  Left justify the result within the given field width (assumes that a field width has been specified).
"+"  Prefix the output value with a sign (+ or −) if the output value is of a signed type/ This is only valid for numeric conversions using NR1, NR2, or NR3 formats.
" "  Prefix the output value with a space character,
(blank)  if the output value is signed and positive; the blank is ignored if both the bank and + flags appear.

What is claimed is:

1. A method of performing input and output operations between an electronic instrument and a computer system, said computer system comprising a plurality of types of interfaces, wherein said method is independent of the type of interfaces used to connect said instrument to said computer system, said method comprising the steps of:
  (a) retrieving an interface type and interface address of said instrument from a configuration means, wherein said configuration means is separate and independent from said instrument;
  (b) using information from said configuration means to create an instrument identification data structure;
  (c) receiving all input and output operation subroutine calls from a user program through an instrument programming interface means;
  (d) creating a plurality of interface module means, one of said plurality of interface module means being created for each of said types of interfaces;
  (e) using said instrument identification data structure to select one of said plurality of interface module means;
  (f) performing said input and output operations using said selected interface module means; and
  (g) performing said input and output operations through a commander interface means and through a second computer system acting as a commander.

2. The method of claim 1 wherein step (f) further comprises the steps of:
  (f1) formatting any output data before sending said data to said instrument using formatted data types defined by said type of interface connecting said instrument and said computer system; and
  (f2) unformatting any data received from said instrument using formatted data types defined by said type of interface connecting said instrument and said computer system.

3. The method of claim 1 further comprising the step of:
  (h) performing a second set of input and output operations within said instrument programming interface means, said second set being identical to the input and output operations performed in step (f), a subset of the second set may include operations which are unnecessary in some of said types of interfaces, whereby said user program uses a same set of operations regardless of said type of interface.

4. The method of claim 1 wherein step (f) further comprises the step of:
  (f1) if said user program requests a combined output and input operation, performing both said output and input operations without allowing interrupts between said output and said input operations.

5. A system for performing input and output operations between an electronic instrument and a computer system through one of a plurality of types of interfaces used to connect said instrument to said computer system, wherein said method is independent of said plurality of types of interfaces, said system comprising:
  instrument programming interface means for receiving all input and output operation subroutine calls from a user program;
  a plurality of interface module means, one for each of said plurality of interface types;
  configuration means, separate and independent from said instrument, for providing an interface type and interface address of said instrument;
  means for accessing said configuration means and for creating an instrument identification data structure;
  means within said instrument programming interface means for using said instrument identification data structure to select one of said plurality of interface module means; and
  means for performing said input and output operations using said selected interface module means.

6. The system of claim 5 wherein said instrument programming interface means further comprises commander interface means for performing input and output operations through a second computer system acting as a commander.

7. The system of claim 5 wherein said instrument programming interface means further comprises means for performing a second set of input and output operations within said instrument programming interface, said second set being identical to the input and output operations performed by said means for performing said input and output operations, a subset of the second set may include operations which are unnecessary in some of said types of interfaces, whereby said user program uses a same set of operations regardless of said type of interface.

8. The system of claim 5 wherein said means for performing said input and output operations further comprises:
  means for performing both said output and input operations without allowing interrupts between said output and said input operations, if said user program requests a combined output and input operation.

9. The system of claim 5 wherein said instrument programming interface means further comprises formatted input and output operation means for converting internal data to a format usable by said instrument.

10. The system of claim 9 wherein said format usable by said instrument comprises number formats unique to at least one of said interface types.

11. A method of accessing an electronic instrument from a computer system, said computer system comprising a plurality of types of interfaces, wherein said method is independent of the type of operating system used within said computer system, said method comprising the steps of:
  (a) retrieving an interface type and interface address of said instrument from a configuration means, wherein said configuration means is separate and independent from said instrument;
  (b) accessing said configuration means and creating an instrument identification data structure;
  (c) receiving all input and output subroutine calls from a user program through an instrument programming interface means;
  (d) creating a plurality of interface module means, one of said plurality of interface module means being created for each of said types of interfaces;
  (e) using said instrument identification data structure to select one of said plurality of interface module means; and
  (f) performing said input and output subroutine calls using said selected interface module means; and
  (g) performing a second set of input and output functions within said instrument programming interface means, said second set being identical to the input and output operations performed in step (f), a subset of the second set may include functions which are unnecessary in some of said types of operating systems, whereby said user program uses a same set of functions regardless of said type of operating system.

12. The method of claim 11 further comprising the step of:
(h) performing said input and output through a commander interface means and through a second computer system acting as a commander.

13. The method of claim 11 wherein step (e) further comprises the steps of:
(f1) formatting any output data before sending said data to said instrument using formatted data types defined by said type of interface connecting said instrument and said computer system; and
(f2) unformatting any data received from said instrument using formatted data types defined by said type of interface connecting said instrument and said computer system.

14. The method of claim 11 wherein step (f) further comprises the step of:
(f1) if said user program requests a combined output and input operation, performing both said output and input operation without allowing interrupts between said output and input operation.

* * * * *